US010765030B2

(12) United States Patent
White et al.

(10) Patent No.: US 10,765,030 B2
(45) Date of Patent: Sep. 1, 2020

(54) ADAPTERS FOR RACK-MOUNTED COMPUTING EQUIPMENT

(71) Applicant: Vapor IO Inc., Austin, TX (US)

(72) Inventors: Steven White, Austin, TX (US); Nick Velander, Austin, TX (US)

(73) Assignee: Vapor IO Inc., Austin, TX (US)

( * ) Notice: Subject to any disclaimer, the term of this patent is extended or adjusted under 35 U.S.C. 154(b) by 305 days.

(21) Appl. No.: 15/165,590

(22) Filed: May 26, 2016

(65) Prior Publication Data

US 2017/0127552 A1 May 4, 2017

Related U.S. Application Data

(60) Provisional application No. 62/248,788, filed on Oct. 30, 2015.

(51) Int. Cl.
*H05K 7/14* (2006.01)

(52) U.S. Cl.
CPC ......... *H05K 7/1492* (2013.01); *H05K 7/1489* (2013.01)

(58) Field of Classification Search
CPC ............................ H05K 7/1489; H05K 7/1492
USPC .............................................. 361/699; 211/26
See application file for complete search history.

(56) References Cited

U.S. PATENT DOCUMENTS

| | | | |
|---|---|---|---|
| 6,133,526 A | 10/2000 | Lebo et al. | |
| 7,573,715 B2* | 8/2009 | Mojaver | G06F 1/181 361/716 |
| 7,697,305 B2* | 4/2010 | Meyer | H01B 7/2806 174/254 |
| 8,320,125 B1 | 11/2012 | Hamburgen et al. | |
| 8,438,893 B2* | 5/2013 | Durney | B21D 5/00 72/324 |
| 8,505,258 B2* | 8/2013 | Durney | B21D 5/00 493/352 |
| 8,867,204 B1 | 10/2014 | Gardner | |
| 2002/0098792 A1 | 7/2002 | Hsiao | |

(Continued)

OTHER PUBLICATIONS

Open Compute Project—Open Rack Standard V1.1, http://www.opencompute.org/wiki/Open_Rack/SpecsAndDesigns, Mar. 2014, pp. 1 to 12.

(Continued)

*Primary Examiner* — Nidhi Thaker
(74) *Attorney, Agent, or Firm* — Pillsbury Winthrop Shaw Pittman, LLP (57) ABSTRACT

Provided is an adapter for rack-mounted computing equipment, the adapter including: a chassis; two mounts coupled to the chassis, each of the two mounts having a respective hole shaped to receive and support rack-mountable computing equipment, wherein centers of the holes are between 460 and 470 mm (millimeters) apart from one another in a side-to-side direction of the chassis; two members extending from front of the chassis, the two members being less than 18 mm tall and being between 530 and 550 mm apart in the side-to-side direction; a channel extending at least half a distance along the chassis in a front-to-back direction, the channel defining a volume configured to hold cables extending from a back side of the chassis to a front side of the chassis; and a bus-bar connector mount configured to position a bus-bar connector extending from a back of the chassis.

24 Claims, 4 Drawing Sheets

(56) References Cited

U.S. PATENT DOCUMENTS

| | | |
|---|---|---|
| 2003/0116515 A1 | 6/2003 | Ureshino |
| 2005/0201073 A1* | 9/2005 | Pincu ................... H04Q 1/02 |
| | | 361/797 |
| 2006/0209475 A1 | 9/2006 | Cabrera et al. |
| 2007/0242420 A1 | 10/2007 | Hoshino et al. |
| 2007/0256957 A1 | 11/2007 | Herrmann et al. |
| 2008/0212265 A1 | 9/2008 | Mazura et al. |
| 2009/0251860 A1 | 10/2009 | Belady et al. |
| 2010/0110628 A1 | 5/2010 | Barrenechea et al. |
| 2011/0116226 A1 | 5/2011 | Yang |
| 2011/0317971 A1 | 12/2011 | Zhang et al. |
| 2012/0103843 A1 | 5/2012 | Wei |
| 2012/0111817 A1* | 5/2012 | Sweeny ............... H05K 7/1489 |
| | | 211/133.6 |
| 2012/0128507 A1 | 5/2012 | Scheidler |
| 2012/0134096 A1 | 5/2012 | Zhang |
| 2012/0224313 A1 | 9/2012 | Hu et al. |
| 2013/0107450 A1* | 5/2013 | Zhang ................. H05K 7/1489 |
| | | 361/679.58 |
| 2013/0133350 A1 | 5/2013 | Reytblat |
| 2013/0163198 A1 | 6/2013 | Li et al. |
| 2013/0229780 A1 | 9/2013 | Trudeau et al. |
| 2014/0113539 A1 | 4/2014 | Dickinson et al. |
| 2014/0137491 A1 | 5/2014 | Somani et al. |
| 2014/0177163 A1 | 6/2014 | Wiley |
| 2014/0268528 A1* | 9/2014 | Mick ................... H05K 7/1491 |
| | | 361/679.02 |
| 2015/0090679 A1* | 4/2015 | Obernesser .......... H05K 7/1488 |
| | | 211/26 |
| 2015/0181758 A1 | 6/2015 | Kang |
| 2015/0289405 A1* | 10/2015 | Stewart ................. H05K 7/183 |
| | | 211/26 |
| 2016/0329689 A1* | 11/2016 | Yi ........................... H02B 1/20 |

OTHER PUBLICATIONS

International Search Report & Written Opinion for Related Application PCT/US2016/021515, dated Jun. 17, 2016, pp. 1 to 13.
International Search Report & Written Opinion or Related Application PCT/US2016/021521, dated Jun. 20, 2016, pp. 1 to 13.
International Search Report in related International Application No. PCT/US2016/034328 dated Aug. 24, 2016 (4 pages).
Written Opinion of the International Searching Authority in related International Application No. PCT/US2016/034328 dated Aug. 24, 2016 (6 pages).
International Preliminary Report on Patentability in related International Application No. PCT/US2016/034328 dated May 1, 2018.

\* cited by examiner

ADAPTERS FOR RACK-MOUNTED COMPUTING EQUIPMENT

CROSS-REFERENCE TO RELATED APPLICATIONS

The present application claims the benefit of U.S. Provisional Patent Application 62/248,788, titled RACK FOR COMPUTING EQUIPMENT, filed 30 Oct. 2015. The entire content of each parent application is incorporated by reference in its entirety.

BACKGROUND

1. Field

The present invention relates generally to computing equipment and, more specifically to adapters for rack-mounted computing equipment.

2. Description of the Related Art

Rack-mounted computers have a long history in the telecommunications and computing industries. Often, computing devices are stored and operated on specialized racks that array the computing devices in standardized spacing, with standardized mechanical (and in some cases electrical or optical) interfaces. With the advent of cloud-based computing, the importance of these racks has expanded dramatically, as increasing amounts of computing power is deployed in datacenters built with these types of racks.

SUMMARY

The following is a non-exhaustive listing of some aspects of the present techniques. These and other aspects are described in the following disclosure.

Some aspects include an adapter for rack-mounted computing equipment, the adapter including: a chassis; two mounts coupled to the chassis, each of the two mounts having a respective hole shaped to receive and support rack-mountable computing equipment, wherein centers of the holes are between 460 and 470 mm (millimeters) apart from one another in a side-to-side direction of the chassis; two members extending from front of the chassis, the two members being less than 18 mm tall and being between 530 and 550 mm apart in the side-to-side direction; a channel extending at least half a distance along the chassis in a front-to-back direction, the channel defining a volume configured to hold cables extending from a back side of the chassis to a front side of the chassis; and a bus-bar connector mount configured to position a bus-bar connector extending from a back of the chassis.

BRIEF DESCRIPTION OF THE DRAWINGS

The above-mentioned aspects and other aspects of the present techniques will be better understood when the present application is read in view of the following figures in which like numbers indicate similar or identical elements.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Designs for data center racks and rack-mounted computer equipment are separated by different design philosophies, between which there is relatively little interaction. On one side are those marketing designs that arose when much of the equipment was subject to proprietary designs. Many of these designs comply with the relatively-well established 19-inch server rack specifications. On the other side are newer, open-source based designs arising in recent years, the most prominent example being the family of designs emerging from the Open Compute Project. Many of these open-source designs are the result of comprehensively re-thinking how computing equipment should be built. As a result, backward compatibility was, in many cases, avoided by the designers, leaving the industry with a fractured inventory of computing equipment that either works in one ecosystem or the other, but not both.

Indeed, some of the reasons the adoption rate of Open Compute servers has been slow is thought to be due to potential large upfront cost associated with purchasing Open Compute Project (OCP) open racks (Open Racks) as well as IT gear compatible with the Open Rack. Among other incompatibilities, the Open Compute Project changed the standards for server racks from 44 to 48 millimeters in height and from 19 to 21 inches in width.

Particular challenges arise when attempting to use computing equipment designed for one rack-standard in a rack that complies with a different standard. Mechanical and thermal loads make it difficult to adapt between rack designs, and computing equipment often has relatively tight constraints for securely holding equipment and dissipating heat. Further, wiring of rack-mounted equipment has become very complex, and this complexity needs to be managed, or at least not exacerbated when changing rack designs. Finally, cost constraints often make it difficult to justify expensive hardware for every instance of rack-mounted computing device that might mitigate some of these challenges.

The change in rack standards broke compatibility with traditional hardware. Few customers may be willing to take the chance on such a large portion of their IT budget. The Open Compute Project changed the standards for server racks from 44 to 48 millimeters in height and from 19 to 21 inches in width. Traditional racks standards are available from the following entities: Electronic Industries Alliance EIA-310-D, Cabinets, Racks, Panels, and Associated Equipment, dated September 1992. (Latest Standard Now REV E 1996); Consumer Electronics Association CEA-310-E design requirements for Cabinets, Panels, Racks and Sub-racks., dated Dec. 14, 2005; International Electrotechnical Commission; Deutsches Institut für Normung DIN 41494. Some of the reasons the adoption rate of Open Compute servers has been slow is thought to be due to potential large upfront cost associated with purchasing Open Compute Project (OCP) open racks (Open Racks) as well as IT gear compatible with the Open Rack.

Embodiments of the 19 inch Server Adapter for an OCP (Open Compute Project) open rack described herein are expected to allow use of 19 inch gear in 21 inch rack, or similar techniques may be applied to adapt between other formats. The 19 inch Server Adapter may help reduce the cost of trying out Open Compute hardware. Customers may purchase the open rack only and use their existing servers that comply with the other standards. The design of the 19 inch Server Adapter for an OCP open rack, described herein, is expected to allow traditional 19 inch gear to run in the same rack as Open Compute hardware, which may facilitate easy comparison in performance, ease transition cost, and leverage legacy hardware in new data center designs.

The complexity of adapting between these standards is not limited to merely accommodating different sizes. The arrangement of connectors is different in different versions of the standards, making it difficult to service servers designed for one standard when placed in a rack for another standard. Further, in some cases, different power and signaling techniques are used in the different standards that can further complicate use of equipment in the different environments.

Figure 1:
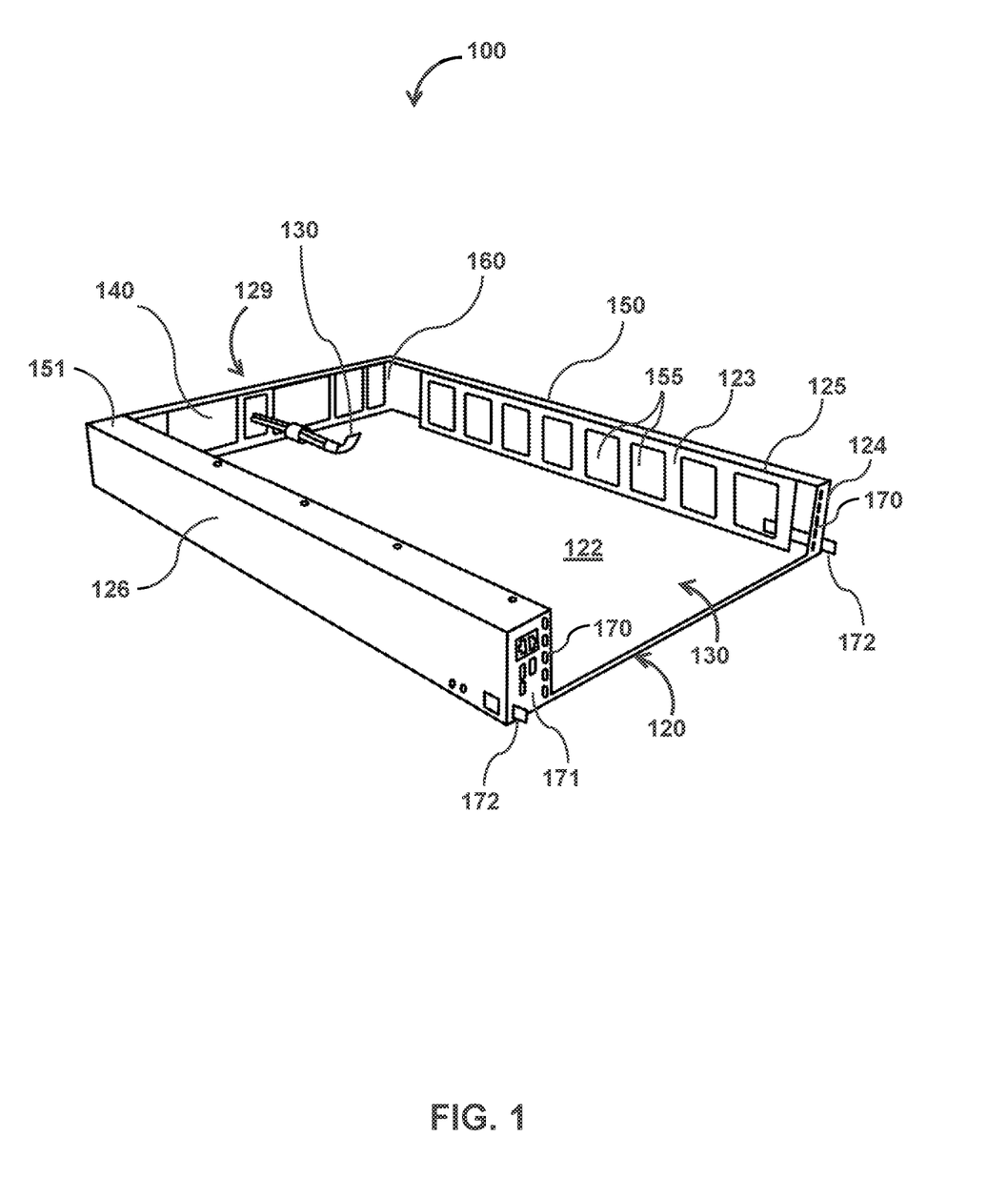
FIG. 1 illustrates a front view of an example of a 19 inch Server Adapter, in accordance with some embodiments.
Figure 2:
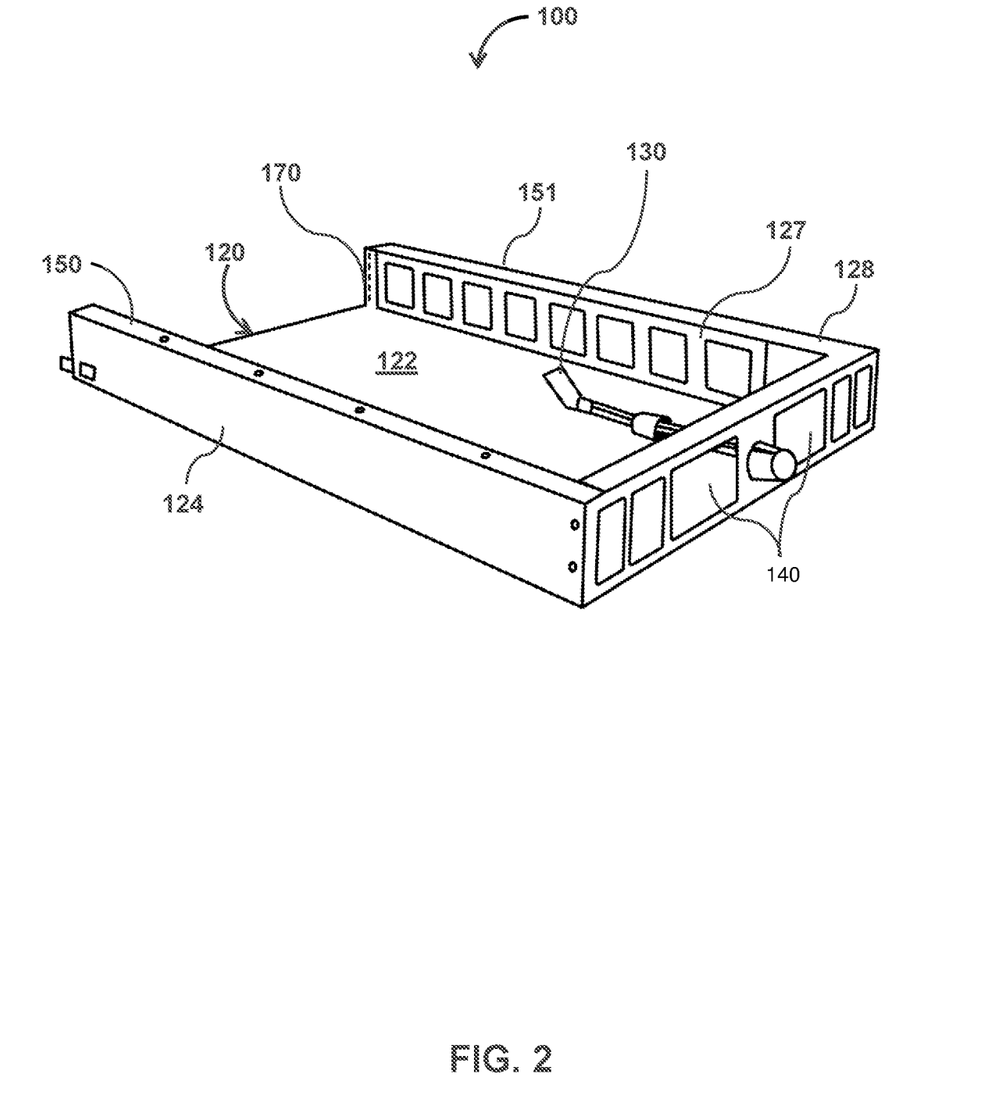
FIG. 2 illustrates a back view of an example of a 19 inch Server Adapter, in accordance with some embodiments.
Figure 3:
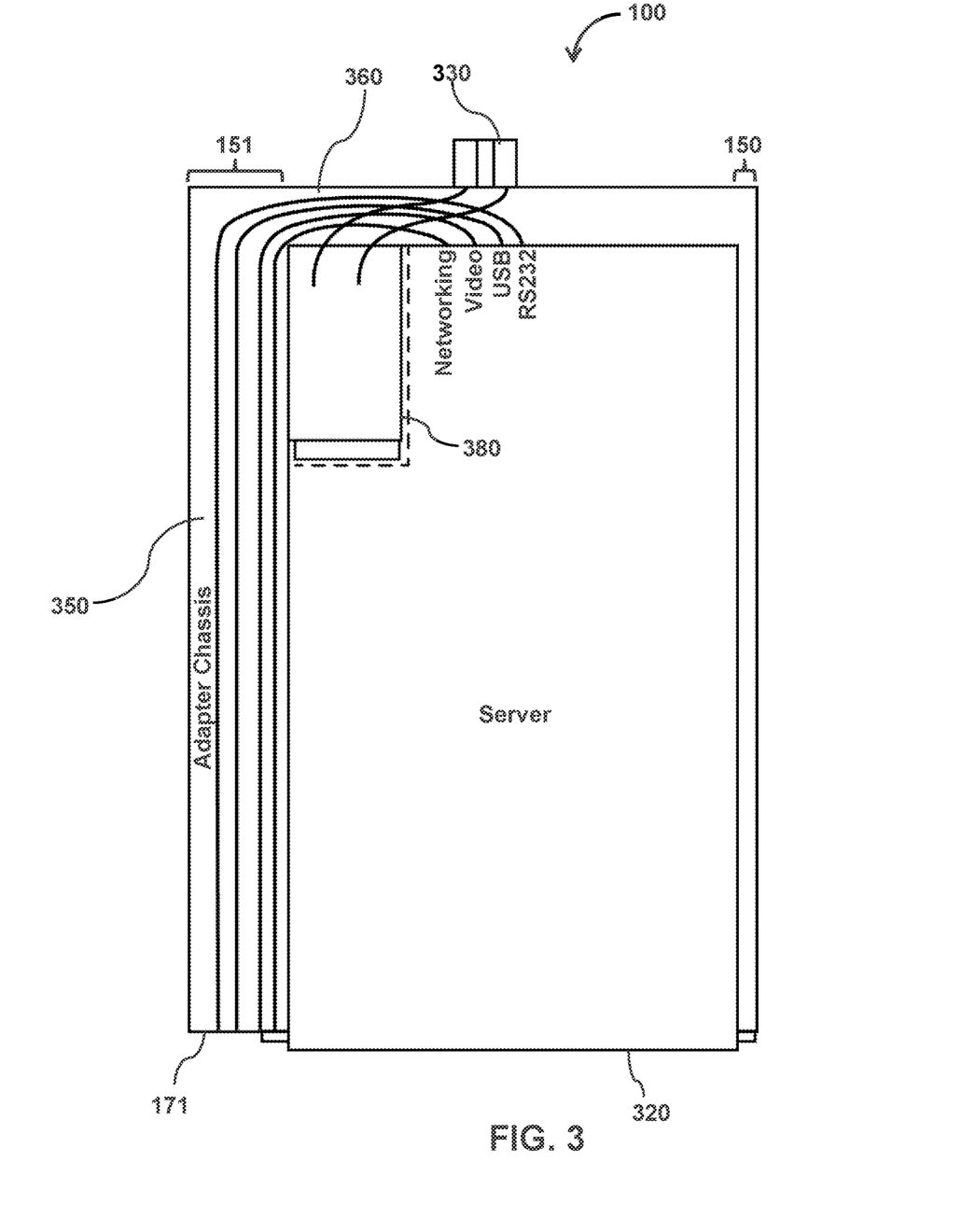
FIG. 3 illustrate is a top view of an example of a 19 inch Server Adapter, in accordance with some embodiments.

To mitigate some or all of these problems, and others, some embodiments, such as those shown in FIG. 1-3, implement a 19 inch Server Adapter. In some cases, the 19 inch Server Adapter may be a standard full width Open Compute chassis of varying OU (Open U) in height (in many variants, the Open Rack is 48 mm tall and the traditional rack unit is 44.5 mm tall). An opening in the front of the chassis may allow a 19 inch server to slide in and its retaining clips may be secured to the front of the chassis. Additional support may be screwed to the rear or side of the 19 inch server to prevent movement. In some embodiments, desired rear input/output (I/O) on the server may be extended to the front of the chassis and exposed on a customizable patch panel area off to one side of the server. It should be noted that use of adaptor 100 described herein is not to be limited to use with the Open U standard. Use of Adaptor 100 with different racks having different dimensions may be considered and is consistent with the techniques described here.

FIG. 1 illustrates a front perspective view of an example of a 19 inch Server Adapter 100 ("adapter 100" hereinafter) in accordance with some embodiments, and FIG. 2 illustrates a back perspective view of the same adapter. Adapter 100 may include a chassis 120, a blind mate connector 130 (e.g., extending from a hot swappable power supply bay having a printed circuit board with a powerline communication modem, in some cases without a rectifier and power supply operative to convert supplied AC power to DC power, as the bus-bar may supply DC power directly to the computing equipment), and plurality of openings 140, hollow channels 150 and 151, gap 160, and one or more mounts 170.

In some embodiments, chassis 120 includes a surface 122, a back side 129, and left and right panels (124 and 126). These components may be arranged to define a generally rectangular prism outer volume corresponding to one or more U's of a rack, e.g., an OCP rack. Within this outer volume, some embodiments may define a smaller, generally rectangular prism inner volume. In some cases, the inner volume may be sized to receive computing equipment that accords with a different standard than that by which the outer volume is sized. In some embodiments, the inner volume may be arrayed asymmetrically to accommodate routing of wiring, which may be of particular relevance when adapting between a front-access standard for rack equipment and a back-access standard (though not all embodiments afford this benefit).

In some cases, surface 122 has a generally rectangular shape. In some embodiments, surface 122 may be interrupted with apertures, e.g., to permit vertical airflow, and in some cases, surface 122 may have ribs or other deformations or appendages that stiffen surface 122. In some cases, surface 122 is a generally planar surface extending from the back side 129 to the front and between the left and right panels 124 and 126. In some cases, surface 122 (and in some cases the sides 126 and 124) is made from an electrically conductive material to afford electromagnetic shielding between adjacent computing devices.

In some embodiments, surface 122 is perpendicular to the right panel 124 to form an "L" shape with the right panel 124 (e.g., approximately perpendicular, for instance, within plus or minus a 20-degree angle from a normal vector to the surface of right panel 124). In some embodiments, the right panel 124 extends along the entire length of the adapter, from front to back.

Left panel 126 may be perpendicularly connected to form an "L" shape with surface 122. Left panel 126 may be parallel to (e.g., approximately parallel, for instance, within plus or minus a 20-degree angle from parallel) to right panel 124. Back side 129 may be perpendicularly connected (e.g., integrally formed, welded, etc.) to form an "L" shape with surface 122. Sides 124 and 126 are on opposite sides of surface 122 and are connected in the back by back side 129.

In some embodiments, back side 129 may include a plurality of openings 140 configured to facilitate connection between computing equipment and rack (for example, an Open-Rack compliant rack). In some embodiments, adapter 100 may include one or more openings 140 on the back that duplicates the hole pattern on a 19 inch rack compliant with a different standard. In some cases, back side 129 may include a plurality of movable plates configured to be moved to accommodate size and shape of connectors to connect with rack computing equipment or rack. For example, some of openings 140 may be of a generally rectangular shape while other openings may be of a generally square shape (other shapes may be considered and are consistent with the techniques described here). In some cases, generally rectangular (e.g., square) opening may have rounded corners, e.g., with a radius on the order of 1 to 10 millimeters, to mitigate stress concentration and stiffen the structure.

In some embodiments, an opening 140 may include connector 130. Connector 130 may be a blind mate connector (e.g., a self-aligned connector) for power on the back of the adapter 100. In some embodiments, power connection between power connector 130 and the server is made when the server slides in adapter 100. In some cases, the alignment of the adapter properly positions the connector to mate with vertical or horizontal bus-bars in the back of a rack. In some cases, back side 129 may include other connectors configured to connect with computing equipment when it slides in adaptor 100. For example, communications, data, or other types of connectors.

In some embodiments, adapter 100 includes two hollow channels 150 and 151. A right channel 150 may be formed by right panel 124, and panels 123 and 125. In some cases, panel 123 has a generally rectangular shape and perpendicularly connected to form an "L" shape with surface 122. Panel 123 may be parallel to right panel 124. Panel 125 has a generally rectangular shape and perpendicularly connected to form an "L" shape with right panel 124 and panel 123, and may be parallel to surface 122. In some cases, the channel 151 adjacent panel 126 may be wider than the channel 150 adjacent panel 124. In some embodiments, the extra space may accommodate wires extending from the front to the back, as described below with reference to FIG. 3.

FIG. 2 shows left channel 151. Left channel 151 may be formed by left panel 126, and panels 127 and 128. Panel 127 has a generally rectangular shape and perpendicularly connected to form an "L" shape with surface 122. Panel 127 may be parallel to second panel 126. Panel 128 has a generally rectangular shape and perpendicularly connected to form an "L" shape with second panel 126 and panel 127, and may be parallel to surface 122.

In some embodiments, hollow channels 150 and 151 may include windows 155. Hollow channels 150 and 151 may be used for holding, or guiding cables from the back of the adapter to the front of the adapter (as shown in the example of FIG. 3). This is expected to manage and protect the cables. The cables may include for example Ethernet cables with RJ45, VGA, DVI, HDMI, USB cables, high speed connectors (e.g., for 10 Gb and 40 Gb networks), and other cables. In some embodiments, rear input/output (I/O) on the computing equipment (e.g., server, hard drive array, network switch, etc.) may be extended to the front of the chassis via channels 150 and 151 and exposed on a customizable patch panel area off to one side of the server, e.g., on the front face of channel 151 adjacent panel 126. In some cases, the channels may have a gap 160 in the rear end, as shown in FIG. 1, to allow the cables to bend. In some embodiments, the gap may be of about 2 inches (or other sizes may be considered and are consistent with the described techniques, as is the case for other features).

In some embodiments, the chassis 120 may be a monolithic body of material, e.g., a single piece of sheet metal that is cut and bent, to form a relatively inexpensive, stiff adapter. For example, a sheet of metal may be laser cut to include some or all of the illustrated apertures and (in the flat form) may have a generally cross-shape, with extended arms from which the channels and back are to be formed. Next, the arms may be bent upward to form the side panels 124 and 126 and the back 129. In some cases, the bend may occur over some radius (e.g., on the order of 1 mm to 5 mm) to mitigate stress concentrations. In some embodiments, the bend may be performed by edge bending with a wiping die or channel bending. Next, the channels 150 and 151 may be formed by forming two more orthogonal bends, to place the ends of the arms proximate the surface 122. In some embodiments, the arms may have tabs bent back at a 90 degree angle to be spot welded to the surface 122, or some embodiments may have cut, bent tabs in the surface 122 bet upwards to be spot welded to the ends of the arms. Or other attachment techniques may be used, e.g., rivets, or the stiffness of the metal may render such attachment unnecessary. In some embodiments, forming this structure from a monolithic block of material is expected to enhance stiffness (as there are relatively few joints to loosen) and offer relatively low cost construction (though not all embodiments afford these benefits). In some cases, the sheet metal may be coated to impede corrosion, e.g., with a hot zinc dip coating.

In some embodiments, the chassis 120 may be made with one or more other materials. In some embodiments, the structure is made from a composite material, e.g., fiber glass, carbon fiber, or the like. For instance, some embodiments may include embedded metal interfaces attached to such materials. In some embodiments, a portion of the chassis 122 may be cut, stamped sheet metal, while another portion is a composite material having an epoxy base in which a fiber is embedded. Composite materials are expected to dampen vibrations, though not all embodiments afford this advantage. In some embodiments, the materials may be electrically conductive and connected to the rack to provide a ground path.

In operation, the chassis 120 may transfer a mechanical load from computing equipment (e.g., due to gravity and vibrations) to a rack, e.g., to an Open Rack. In some cases, tabs extending from the front of the chassis 120 may be inserted into a generally rectangular hole in an array of rectangular holes in a rack, and tabs extending from the back of the chassis 120 may be similarly inserted. In some cases, the adapter 100 may be mounted to rails (e.g., with linear bearings) by which the adapter is slide into and out of a rack. In some embodiments, the computing equipment may be similarly mounted in the adapter 100. For instance, an array of rectangular holes in the front of the adapter 100 may receive a tab extending from computing equipment. The equipment may rest on surface 122, or in some embodiments, a similar array of rectangular holes may be provided by a bracket mounted to the adapter 100 near the rear of the adapter 100.

In some cases, the adapter 100 accommodates tool-less maintenance for many common maintenance tasks. In some cases, the blind mate may connect to a 12 volt bus-bar positioned on a rack, e.g., extending vertically behind a stack of such adapters. In some embodiments, as the adapter is slid backward into the rack, the rack may vertically and horizontally position the adapter, and the adapter may vertically and horizontally position the blind-mate connector, such that the connector mates with the bus-bar as the adapter is slid into place. In some cases, during this part of the installation process, the blind mate connector may have only one degree of freedom relative to the rack (translating forward and backward), and the bus-bar and connector may have zero degrees of freedom relative to the rack and adapter, respectively. In some cases, computing devices may have a hot swap controller to manage electrical connections when connecting and disconnecting with the bus-bar.

In some cases, the adapter 100 may direct and channel the flow of a cooling fluid over the computing equipment. For instance, the apertures in the back of the adapter may permit air to flow between the front of the rack 130 and the back 129, from a lower pressure side to a higher pressure side, and the air may carry heat away from the computing equipment operating therein. In some embodiments, the curved edges of the generally rectangular holes in the back of the rack, along with the structural support provided by a monolithic design, may permit a front-to-back airflow path that is relatively un-obstructed, as these other design choices are expected to permit relatively narrow members along the back of the chassis and a relatively large amount of open space for airflow.

FIG. 3 illustrates a top view of an example of an adapter 100 connected to a standard 19 inch server 320 (for example, an EIA server) having a power-line modem and controller 380. In this embodiment, the power connection between the 19 inch server and rack (or bus-bar) is made via blind mate 330. Cables 360 may be guided to the front via path 350 through the left channel 151. FIG. 3 shows an example of cable connections including networking, video, USB, and RS232 cables. Other cable connections may be included. Cables 360 may be extended to the front of adaptor chassis for use with a front facing patch panel 171 for example. In some cases, the cables may be installed before adapter/server (or other computing equipment) is put in rack. In some cases, such cables may convert a server installed in the adapter from a rear-access server to a front-access server, with connections for the server exposed on the front. In some cases, this adaptation may facilitate use with the front-access rack designs. In some embodiments, the cables extend to a front-side patch panel 171 having an array of connectors for interfacing with the computing equipment via the cables.

Routing the cables from front to back within the adapter 100 is expected to facilitate maintenance and installation. In some cases, the cabling may be placed with the adapter 100 un-installed in a rack, while the cabling and connectors are relatively ergonomically accessible to a technician. The hollow channels 150 and 151 may contain the cabling, keeping it organized and spaced away from both from the rack and the computing device adapted within the adapter 100. Then, the assembly may be slid into place, with relatively little additional effort expended while at the rack. Further, the front-mount cabling access (with data access at the front and power access at the rear) is expected to afford relatively efficient access for maintenance and troubleshooting, as a technician can avoid traveling to a hot-aisle on the rear of the equipment, or repeated walking back and forth between the hot aisle and the cold aisle.

Rack computing equipment may include retaining clips 172 that protrude on each side and lock the front of a server into place in the rack. The retaining clips may be generally configured to allow the rack computing equipment to be fastened to a rack (e.g., standard 19 inch rack, or open rack). In some cases, the clips extending from the front of the adapter 100 may be spaced and shaped to secure the adapter 100 to vertical mounting rails of a rack, such as an Open Compute Project Open Rack Version 1.1 standard rack. In some embodiments, the rack may include a bus-bar extending along the back of the rack vertically, and the bus-bar may carry 12 Volt DC power. The rack may include vertical mounting rails, e.g., at each corner, with 14 by 18 mm holes arrayed along the vertical length of the rails. The tabs extending from the front (and in some cases the back) of the adapter 100 may be inserted into these holes to vertically position and secure the adapter 100. In some cases, the tabs may be less than 18 mm, e.g., between 10 and 17.9 mm, like around 17 mm. In some cases, the tabs may be between 530 and 550 mm apart, e.g., around 539 mm.

In some embodiments, adapter 100 may include a plurality of holes on the sides, back, or on the bottom configured to receive locking pins from a server. This is expected to facilitate installation, removal, or maintenance of the server.

In some embodiments, the adapter may include a pair (or two pairs, front and back) of mounts 170 for an EIA-310 19 inch compliant server (or other computing equipment). In some embodiments, a mount may be disposed in each corner of the inner rectangular prism defined by the adapter 100. In some embodiments, each mount may include an array of rectangular holes, e.g., on a rack post extending within the adapter 100, e.g., integrally formed, or welded to, as a bracket. The array may extend vertically (in the depicted orientation), with each hole disposed is spaced relation to the others along a line. In some cases, the pitch between the holes may be between 16 and 17 mm (e.g., approximately 15.9 mm. In some cases, the 19-inch computing device may be positioned to align with the vertical middle of one of these holes. In some cases, each hole may have a generally square shape and may have sides of around 12 to 14 mm, e.g., approximately 12.7 mm. In some cases, the mounts may be positioned such that the array of holes extend along generally parallel lines, with the horizontal distance between the holes being around 450 to 480 mm, e.g., 465 mm, for the mounts (center to center of the holes, extending left to right in the illustrated orientations). In some cases, the holes for the mount have other shapes, e.g., threaded holes. In some cases, the adapter 100 may accommodate inserts for different types of computing equipment, e.g. an insert for equipment needing square holes and another insert for equipment needing round holes. The holes may have various orientations, depending upon the design. In some cases, the holes may be oriented in the same direction for the left and right mounts, as illustrated, e.g., front to back, or in some cases, the holes may face each other, e.g., side to side.

In some embodiments, adapter 100 may include one or more retaining clips 172 located on opposite sides of the front of the chassis and configured to allow rack computing equipment to be fastened to adapter 100. In some embodiments, additional support may be screwed to the rear or side of the rack computing equipment to prevent movement for example.

In some embodiments, adapter 100 may be configured to be placed directly on a rack. For example, adapter 100 may be fastened to the rack (or mounted on the rack) with screws. In some embodiments, adapter 100 may be configured to be mounted to rails or shelf on the rack. This is expected to support heavy equipment placed on adapter 100 in some cases. In some embodiments, the adapter may slide on the rack along the rails. This may allow easy access to equipment, on adapter 100, for inspection or maintenance. In some embodiments, the adapter may include one or more "L" brackets for sliding on rails or a shelf In some embodiments, adapter 100 may include a locking mechanism that allows the adapter to lock in various positions along the rails of shelve.

In some embodiments, adapter 100 may be configured to tilt upward or downward within the rack (for example with a tilting mechanism). In some cases, adapter 100 may be configured to tilt upward or downward regardless of whether the rails or shelf are extended. In some embodiments, adapter 100 may support the rack computing equipment when the adapter slides forward on the rack, rails or shelf.

Thus, various embodiments provide certain advantages, depending upon which of the presently described inventive techniques are used. Advantages include providing rear to front server I/O; bus-bar blind connection; providing power link communications; sending data over 12 volt DC; works in harsh environments; replacing Ethernet connection; additional wiring may not be needed; network switch may not be needed; no need to replace the primary high speed connection; replacing low speed out of band network; turning servers on and off; monitoring sensors; local console log inns for maintenance on server, etc. It should be noted though, that these inventions are independently useful, and not all embodiments provide all of these advantages. In some embodiments, the 19 inch Server Adapter described here is compatible with other products from Vapor IO, Inc., or may also be used with other Open Compute systems.

Figure 4:
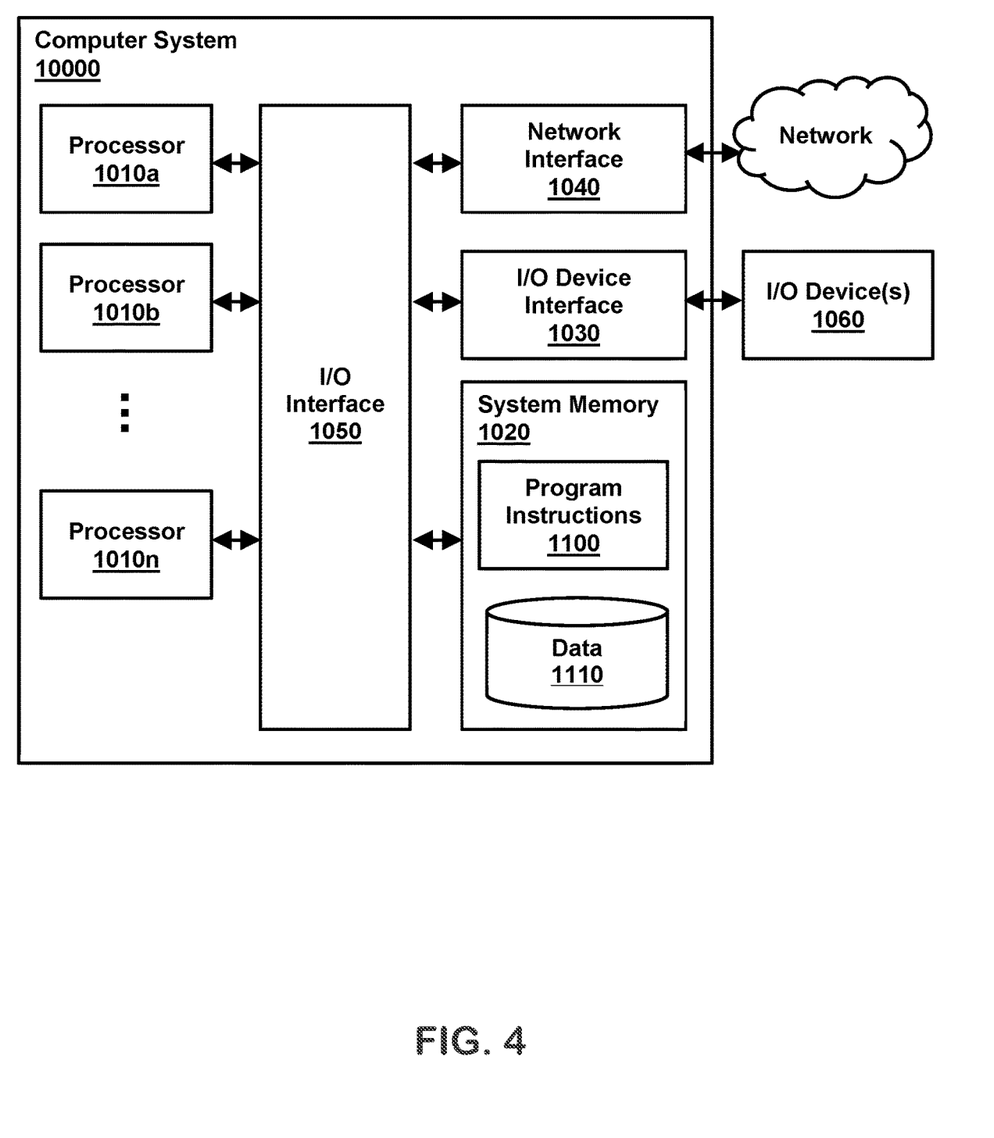
FIG. 4 illustrates components of a computing device that may be disposed and interconnected in server adapter of FIG. 1.

FIG. 4 is a diagram that illustrates an exemplary computing system 1000 in accordance with embodiments of the present technique. In some cases, each U in each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y," "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. An adapter for rack-mounted computing equipment, the adapter comprising: a chassis; two mounts coupled to the chassis, each of the two mounts having a respective hole shaped to receive and support rack-mountable computing equipment, wherein centers of the holes are between 460 and 470 mm (millimeters) apart from one another in a side-to-side direction of the chassis; two members extending from front of the chassis, the two members being less than 18 mm tall and being between 530 and 550 mm apart in the side-to-side direction; a channel extending at least half a distance along the chassis in a front-to-back direction, the channel defining a volume configured to hold cables extending from a back side of the chassis to a front side of the chassis; and a bus-bar connector mount configured to position a bus-bar connector extending from a back of the chassis.
2. The adapter of embodiment 1, wherein: the channel terminates in a face plate having openings for at least two different kinds of connectors at a front of the chassis.
3. The adapter of any of embodiments 1-2, wherein: the channel has an opening of at least 40 mm in a front-to-back direction on an interior side of the channel in a back half of the adapter.
4. The adapter of any of embodiments 1-3, wherein: the chassis is integrally formed from a monolithic body of material.
5. The adapter of any of embodiments 1-4, wherein the chassis is formed from a single sheet of cut and bent sheet metal having an anticorrosive coating.
6. The adapter of any of embodiments 1-5, wherein at least one of the mounts has an array of the holes extending in a direction generally orthogonal both to the side-to-side direction and to the front-to-back direction.
7. The adapter of any of embodiments 1-6, comprising the bus-bar connector, wherein the bus-bar connector is configured to have a single degree of freedom relative to a rack as the chassis is slide backward into the rack.
8. The adapter of any of embodiments 1-7, comprising tabs extending from a rear of the chassis, on each side of the chassis.
9. The adapter of any of embodiments 1-8, wherein the two mounts are asymmetrically disposed within the chassis in the side-to-side direction.
10. The adapter of any of embodiments 1-9, wherein the two mounts each comprise an array of holes, each of the holes being oriented in the front-to-back direction, each of the holes being a generally square hole with slides of between 12 and 14 mm, each array having a hole-to-hole pitch of between 16 and 17 mm.
11. The adapter of any of embodiments 1-10, comprising a plurality of fluid-flow holes on at least one side of the bus-bar connector mount shaped to pass a cooling fluid flowing between a front of the chassis and the back of the chassis.
12. The adapter of embodiment 11, wherein at least some of the fluid-flow holes are generally rectangular holes having at least some rounded corners.
13. The adapter of any of embodiments 1-12, comprising three bus-bar connector mounts arrayed along the back of the chassis.
14. The adapter of any of embodiments 1-13, comprising a blind-mate bus-bar connector secured to the bus-bar connector mount.
15. The adapter of any of embodiments 1-14, comprising another channel extending along a front-to-back length of the adapter, the two channels spanning an interior volume configured to receive a 19-inch server.
16. The adapter of embodiment 15, wherein the other channel has at least 3 generally square holes arrayed along the length of the other channel.
17. The adapter of any of embodiments 1-16, comprising: means for providing front-side data access; and means for providing back-side power.
18. The adapter of any of embodiments 1-17, comprising: at least three different types of cables disposed within the channel.
19. The adapter of any of embodiments 1-18, comprising: a rack comprising a plurality of adapters arrayed in the rack.
20. The adapter of embodiment 19, comprising: a plurality of computing devices mounted in the plurality of adapters.

What is claimed is:

1. An adapter for rack-mounted computing equipment, the adapter comprising:
   a chassis;
   two mounts coupled to the chassis, each of the two mounts having a respective hole shaped to receive and support rack-mountable computing equipment, wherein centers of the holes are between 460 and 470 mm (millimeters) apart from one another in a side-to-side direction of the chassis;
   two members extending from a front of the chassis, the two members being less than 18 mm tall and being between 530 and 550 mm apart in the side-to-side direction;
   a channel extending at least half a distance along the chassis in a front-to-back direction, the channel defining a volume configured to hold cables extending from a back side of the chassis to a front side of the chassis; and
   a bus-bar connector mount configured to position a blind-mate bus-bar connector extending from a back of the chassis to mate with vertical or horizontal bus-bars in a back of a rack;
   wherein the blind-mate bus-bar connector is configured to be secured to the bus-bar connector mount, and the blind-mate bus-bar connector is configured to provide a power connection to the rack-mounted computing equipment through the mating with the vertical or horizontal bus-bars.

2. The adapter of claim 1, wherein:
   the channel terminates in a face plate having openings for at least two different kinds of connectors at a front of the chassis.

3. The adapter of claim 1, wherein:
   the channel has an opening of at least 40 mm in a front-to-back direction on an interior side of the channel in a back half of the adapter.

4. The adapter of claim 1, wherein:
the chassis is integrally formed from a monolithic body of material.

5. The adapter of claim 4, wherein the chassis is formed from a sheet of metal having a generally cross-shape with extended arms.

6. The adaptor of claim 5, wherein the channels are formed by bending the arms upward to form a left panel and a right panel of the chassis thereby placing ends of the arms proximate a bottom surface of the chassis generally perpendicular to the left and right panels.

7. The adaptor of claim 6, wherein the arms include tabs bent back at a 90 degree angle configured to be spot welded to the bottom of the chassis.

8. The adapter of claim 1, wherein the chassis is formed from a single sheet of cut and bent sheet metal having an anticorrosive coating.

9. The adapter of claim 1, wherein at least one of the mounts has an array of the holes extending in a direction generally orthogonal both to the side-to-side direction and to the front-to-back direction.

10. The adapter of claim 1, comprising the bus-bar connector, wherein the bus-bar connector is configured to have a single degree of freedom relative to a rack as the chassis is slide backward into the rack.

11. The adapter of claim 1, comprising tabs extending from a rear of the chassis, on each side of the chassis.

12. The adapter of claim 1, wherein the two mounts are asymmetrically disposed within the chassis in the side-to-side direction.

13. The adapter of claim 1, wherein the two mounts each comprise an array of holes, each of the holes being oriented in the front-to-back direction, each of the holes being a generally square hole with slides of between 12 and 14 mm, each array having a hole-to-hole pitch of between 16 and 17 mm.

14. The adapter of claim 1, comprising a plurality of fluid-flow holes on at least one side of the bus-bar connector mount shaped to pass a cooling fluid flowing between a front of the chassis and the back of the chassis.

15. The adapter of claim 14, wherein at least some of the fluid-flow holes are generally rectangular holes having at least some rounded corners.

16. The adapter of claim 1, comprising three bus-bar connector mounts arrayed along the back of the chassis.

17. The adapter of claim 1, comprising another channel extending along a front-to-back length of the adapter, the two channels spanning an interior volume configured to receive a 19-inch server.

18. The adapter of claim 17, wherein the other channel has at least 3 generally square holes arrayed along the length of the other channel.

19. The adapter of claim 1, comprising:
means for providing front-side data access;
means for providing back-side power.

20. The adapter of claim 1, comprising:
at least three different types of cables disposed within the channel.

21. The adapter of claim 1, comprising:
a rack comprising a plurality of adapters arrayed in the rack.

22. The adapter of claim 21, comprising:
a plurality of computing devices mounted in the plurality of adapters.

23. The adaptor of claim 1, wherein:
the channel is defined, at least in part, by metal on at least four sides of the channel along at least part of the length of the channel.

24. The adaptor of claim 1, comprising:
the blind-mate bus-bar connector secured to the bus-bar connector mount, wherein:
the blind-mate bus-bar connector is a self-aligning connector configured to establish an electrical connection between a computing device in the chassis and at least some of the vertical or horizontal bus-bars as the chassis is slide backward into the rack,
during installation, the blind-mate bus-bar connector is configured to have only one degree of freedom relative to the rack and zero degrees of freedom relative to the chassis, and
the bus bars are vertical bus bars that extend linearly across receptacles for multiple computing devices in multiple U's of the rack.

\* \* \* \* \*